(12) United States Patent
Bhattacharya et al.

(10) Patent No.: US 9,202,006 B1
(45) Date of Patent: Dec. 1, 2015

(54) SYSTEM AND METHOD FOR CONNECTING COMPONENTS IN AN ELECTRONIC DESIGN

(71) Applicant: Cadence Design Systems, Inc., San Jose, CA (US)

(72) Inventors: Utpal Bhattacharya, Noida (IN); Vikas Kohli, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/550,038

(22) Filed: Nov. 21, 2014

(51) Int. Cl.
*G06F 17/50* (2006.01)
*G06F 3/0484* (2013.01)
*G06F 3/0482* (2013.01)

(52) U.S. Cl.
CPC .......... *G06F 17/5081* (2013.01); *G06F 3/0482* (2013.01); *G06F 3/04842* (2013.01)

(58) Field of Classification Search
CPC ............ G06F 17/5086; G06F 17/5045; G06F 17/5009; G06F 17/5072; G06F 2203/04806; G06F 2217/16; G06F 2217/74; G06F 3/0481; G06F 17/505; G06F 17/5054; G06F 17/5068; G06F 8/34; G06F 9/22; G06F 9/445

USPC ................................. 716/136–139, 100–102
See application file for complete search history.

(56) References Cited

U.S. PATENT DOCUMENTS

| 2011/0131543 | A1* | 6/2011 | Majumder et al. | 716/139 |
|---|---|---|---|---|
| 2011/0131544 | A1* | 6/2011 | Majumder et al. | 716/139 |
| 2012/0117530 | A1* | 5/2012 | Green | 716/139 |

* cited by examiner

*Primary Examiner* — Binh Tat
(74) *Attorney, Agent, or Firm* — Holland & Knight LLP; Mark H. Whittenberger, Esq.

(57) ABSTRACT

The present disclosure relates to a computer-implemented method for visualization in an electronic design. The method may include providing an electronic design and receiving a selection of at least one pin associated with the electronic design at a first graphical user interface. The method may further include generating a stub for each of the selected pins at the first graphical user interface. The method may also include providing a second graphical user interface configured to allow for the assignment of a signal name to each stub. The method may include extending the stub for each of the selected pins to reach a target destination associated with the electronic design. The method may also include displaying the signal name for each stub on at least one of the first graphical user interface and the second graphical user interface.

20 Claims, 18 Drawing Sheets

300

| | | | | |
|---|---|---|---|---|
| MOD5_NCC_PROCEED | C01 | | D01 | MOD5_NCC_IRQ_N |
| MOD5_NCC_CTRL1 | C02 | | D02 | MOD5_NCC_CTRL2 |
| NCC_MOD4_TDO | C03 | | D03 | MOD4_NCC_TDI |
| NCC_MOD4_HSSCK_P | C04 | | D04 | NCC_MOD4_HSSCK_N |
| MOD4_NCC_PROCEED | C05 | | D05 | MOD4_NCC_IRQ_N |
| MOD4_NCC_CTRL1 | C06 | | D06 | MOD4_NCC_CTRL2 |
| NCC_MOD3_TDO | C07 | | D07 | MOD3_NCC_TDI |
| NCC_MOD3_HSSCK_P | C08 | | D08 | NCC_MOD3_HSSCK_N |
| MOD3_NCC_PROCEED | C09 | | D09 | MOD3_NCC_IRQ_N |
| MOD3_NCC_CTRL1 | C10 | | D10 | MOD3_NCC_CTRL2 |
| NCC_MOD2_TDO | C11 | | D11 | MOD2_NCC_TDI |
| NCC_MOD2_HSSCK_P | C12 | | D12 | NCC_MOD2_HSSCK_N |
| MOD2_NCC_PROCEED | C13 | | D13 | MOD2_NCC_IRQ_N |
| MOD2_NCC_CTRL1 | C14 | | D14 | MOD2_NCC_CTRL2 |
| NCC_MOD1_TDO | C15 | | D15 | MOD1_NCC_TDI |
| NCC_MOD1_HSSCK_P | C16 | | D16 | NCC_MOD1_HSSCK_N |
| MOD1_NCC_PROCEED | C17 | | D17 | MOD1_NCC_IRQ_N |
| MOD1_NCC_CTRL1 | C18 | | D18 | MOD1_NCC_CTRL2 |
| NCC_MOD0_TDO | C19 | | D19 | MOD0_NCC_TDI |
| NCC_MOD0_HSSCK_P | C20 | | D20 | NCC_MOD0_HSSCK_N |
| MOD0_NCC_PROCEED | C21 | | D21 | MOD0_NCC_IRQ_N |
| MOD0_NCC_CTRL1 | C22 | | D22 | MOD0_NCC_CTRL2 |
| VDD3 | C23 | | D23 | VDD3 |
| | C24 | | D24 | |
| | C25 | | D25 | |

SYSTEM AND METHOD FOR CONNECTING COMPONENTS IN AN ELECTRONIC DESIGN

FIELD OF THE INVENTION

The present disclosure relates to electronic design automation, and more specifically, to a method for connecting components in an electronic design.

DISCUSSION OF THE RELATED ART

Electronic design automation (EDA) utilizes software tools that may be used in the design and analysis of numerous electronic systems such as printed circuit boards (PCBs) and integrated circuits (ICs). Verification environments include constraints that describe the relationship between the variables that control the simulation (and sometimes the data that is used as well). For example, in order to verify certain IC designs many simulations are run, which may verify different aspects of the design being tested. Each test may run for a certain amount of design time (usually measured in clock cycles) and a certain amount of user time.

In today's schematics, each symbol may have on the order of roughly 100 pins or more. To instantiate the part each symbol is instantiated on a separate page. Wire stubs may be manually drawn on each pin and names may be manually assigned to these stubs. This process is laborious as each connection involves, manually drawing the wire stubs (or complete connectivity) for each pin, manually assigning names to the wires one by one, and manually aligning the names for better readability. Accordingly, at least three operations are required for each connection. For example, for a 200 pin symbol on the schematic it may take anywhere between 100 to 600 operations depending on skills of the user.

SUMMARY

In one or more embodiments of the present disclosure, a computer-implemented method for visualization in an electronic design is provided. The method may include providing an electronic design and receiving a selection of at least one pin associated with the electronic design at a first graphical user interface. The method may further include generating a stub for each of the selected pins at the first graphical user interface. The method may also include providing a second graphical user interface configured to allow for the assignment of a signal name to each stub. The method may include extending the stub for each of the selected pins to reach a target destination associated with the electronic design. The method may also include displaying the signal name for each stub on at least one of the first graphical user interface and the second graphical user interface.

One or more of the following features may be included. In some embodiments, the method may include inserting one or more bus taps at the first graphical user interface. In some embodiments, extending may occur in response to user selection of at least one of the stub and a target pin associated with the target destination. In some embodiments, at least one stub may be associated with a component. The method may include rotating the component within the first graphical user interface, wherein rotating the component includes rotating at least one stub. The method may include converting one or more existing wire connections of the electronic design to a stub. The method may also include adjusting a stub length of the stub based upon, at least in part, a length of the signal name.

In some embodiments, a computer-readable storage medium having stored thereon instructions that when executed by a machine result in one or more operations is provided. Operations may include providing an electronic design and receiving a selection of at least one pin associated with the electronic design at a first graphical user interface. Operations may further include generating a stub for each of the selected pins at the first graphical user interface. Operations may also include providing a second graphical user interface configured to allow for the assignment of a signal name to each stub. Operations may include extending the stub for each of the selected pins to reach a target destination associated with the electronic design. Operations may also include displaying the signal name for each stub on at least one of the first graphical user interface and the second graphical user interface.

One or more of the following features may be included. In some embodiments, operations may include inserting one or more bus taps at the first graphical user interface. In some embodiments, extending may occur in response to user selection of at least one of the stub and a target pin associated with the target destination. In some embodiments, at least one stub may be associated with a component. Operations may include rotating the component within the first graphical user interface, wherein rotating the component includes rotating the at least one stub. Operations may include converting one or more existing wire connections of the electronic design to a stub. Operations may also include adjusting a stub length of the stub based upon, at least in part, a length of the signal name.

In one or more embodiments of the present disclosure, a system for visualization in an electronic design is provided. The system may include one or more processors configured to receive an electronic design and to receive a selection of at least one pin associated with the electronic design at a first graphical user interface. The one or more processors may be further configured to generate a stub for each of the selected pins at the first graphical user interface. The one or more processors may be further configured to provide a second graphical user interface configured to allow for the assignment of a signal name to each stub. The one or more processors may be further configured to extend the stub for each of the selected pins to reach a target destination associated with the electronic design. The one or more processors may be further configured to display the signal name for each stub on at least one of the first graphical user interface and the second graphical user interface.

One or more of the following features may be included. In some embodiments, the one or more processors may be configured to insert one or more bus taps at the first graphical user interface. In some embodiments, extending may occur in response to user selection of at least one of the stub and a target pin associated with the target destination. In some embodiments, the at least one stub may be associated with a component. The one or more processors may be configured to rotate the component within the first graphical user interface, wherein rotating the component includes rotating the at least one stub. The one or more processors may be configured to convert one or more existing wire connections of the electronic design to a stub.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 3 is a system diagram depicting aspects of the connection process in accordance with an embodiment of the present disclosure;

DETAILED DESCRIPTION

Figure 1:
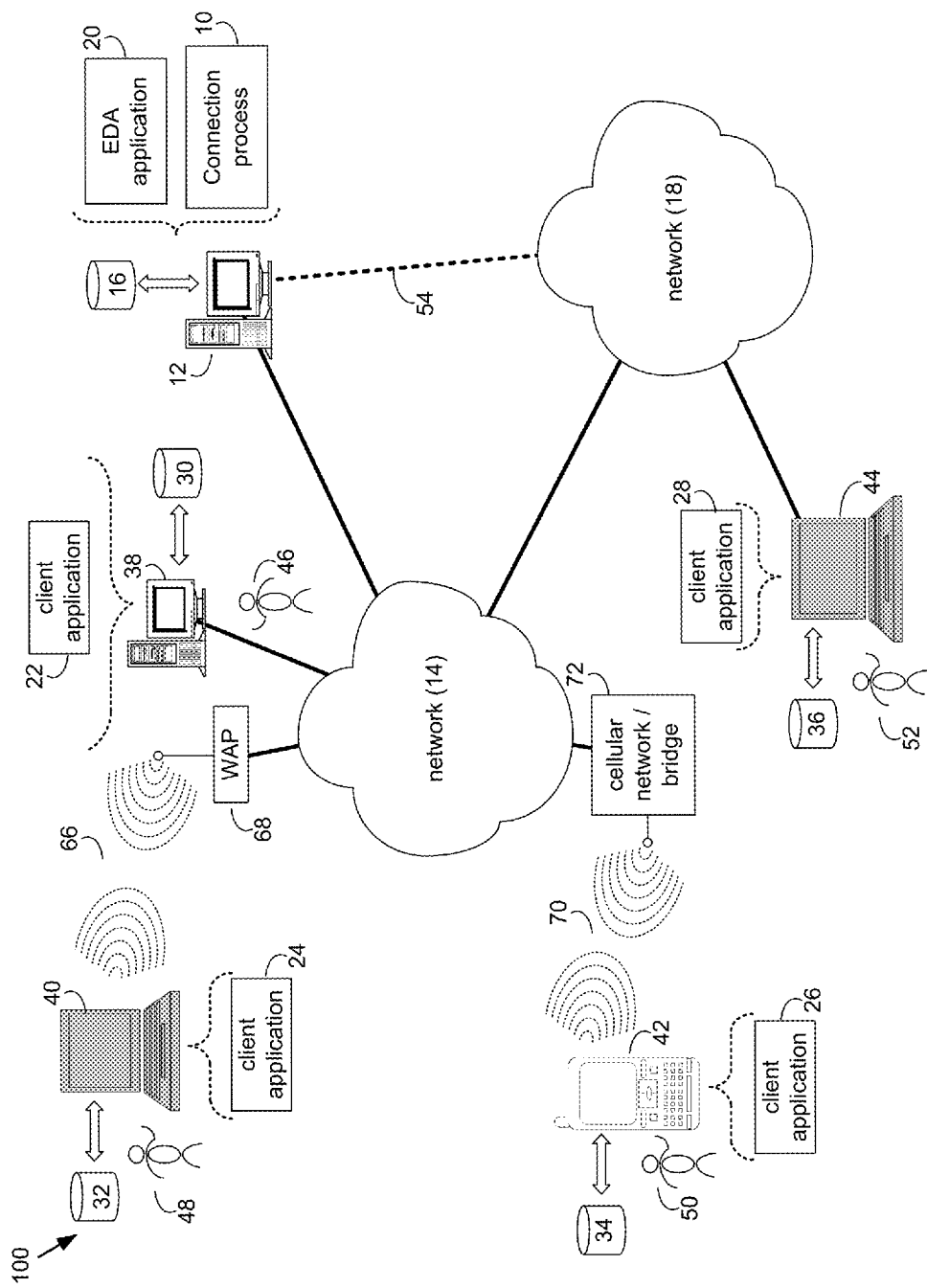
FIG. 1 is a system diagram depicting aspects of the connection process in accordance with an embodiment of the present disclosure.

Embodiments of the present disclosure relate to a system and method for the automatic generation of stubs that may be used in an electronic design. For example, some embodiments may be used to define the connectivity of a large symbol associated with the design. Embodiments of connection process 10, which will be further described in connection with FIG. 1, may provide a new technique for making electrical connections to a group of pins, assigning signal names and displaying them, as well as in tapping out signals simultaneously from a bus. Some embodiments may include inserting one or more bus taps on a moving component and connecting a vector signal using a stub-based approach. Accordingly, embodiments disclosed herein may increase the productivity of electronic design automation tools.

Schematics including a single large pin count symbol per page with stubs have become predominant in the last few years. Existing schematic tools are not aligned with the modern user interfaces of contextual dialogs during an operation. Embodiments of connection process 10 may provide the ability to annotate a name during the drawing of stubs, wires, etc. Using existing approaches designers generally decouple this operation as they think sequentially. However, in many schematics it may be beneficial to perform the signal name planning upfront so it may be desirable to leverage that information. Accordingly, and as discussed below, connection process 10 may provide the ability to annotate a signal name during drawing stubs, wires, etc.

As used herein, the term "stub" may refer to a wire segment that may connect a pin and may have one side unconnected. The term "route" may refer to a wired connection between two pins. The term "bus" may refer to a wire representing a vectored signal. For example, A<0..10>, etc. The term "tap" may refer to a graphical representation of a subset of a vectored signal. The process of adding a "tap" symbol may be referred as "tapping".

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art. In the figures any discussion of like reference numerals may indicate like elements.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown a connection process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the connection process may reside on and be executed, in whole or in part, by a client electronic device, such as a personal computer, notebook computer, personal digital assistant, or the like.

The instruction sets and subroutines of connection process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Connection process 10 may be a stand alone application, or may be an applet/application/script that may interact with and/or be executed within EDA application 20. In addition/as an alternative to being a server-side process, the connection process may be a client-side process (not shown) that may reside on a client electronic device (described below) and may interact with an EDA client application (e.g., one or more of EDA client applications 22, 24, 26, 28). Further, the connection process may be a hybrid server-side/client-side process that may interact with EDA application 20 and an EDA client application (e.g., one or more of client applications 22, 24, 26, 28). As such, the connection process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize connection process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
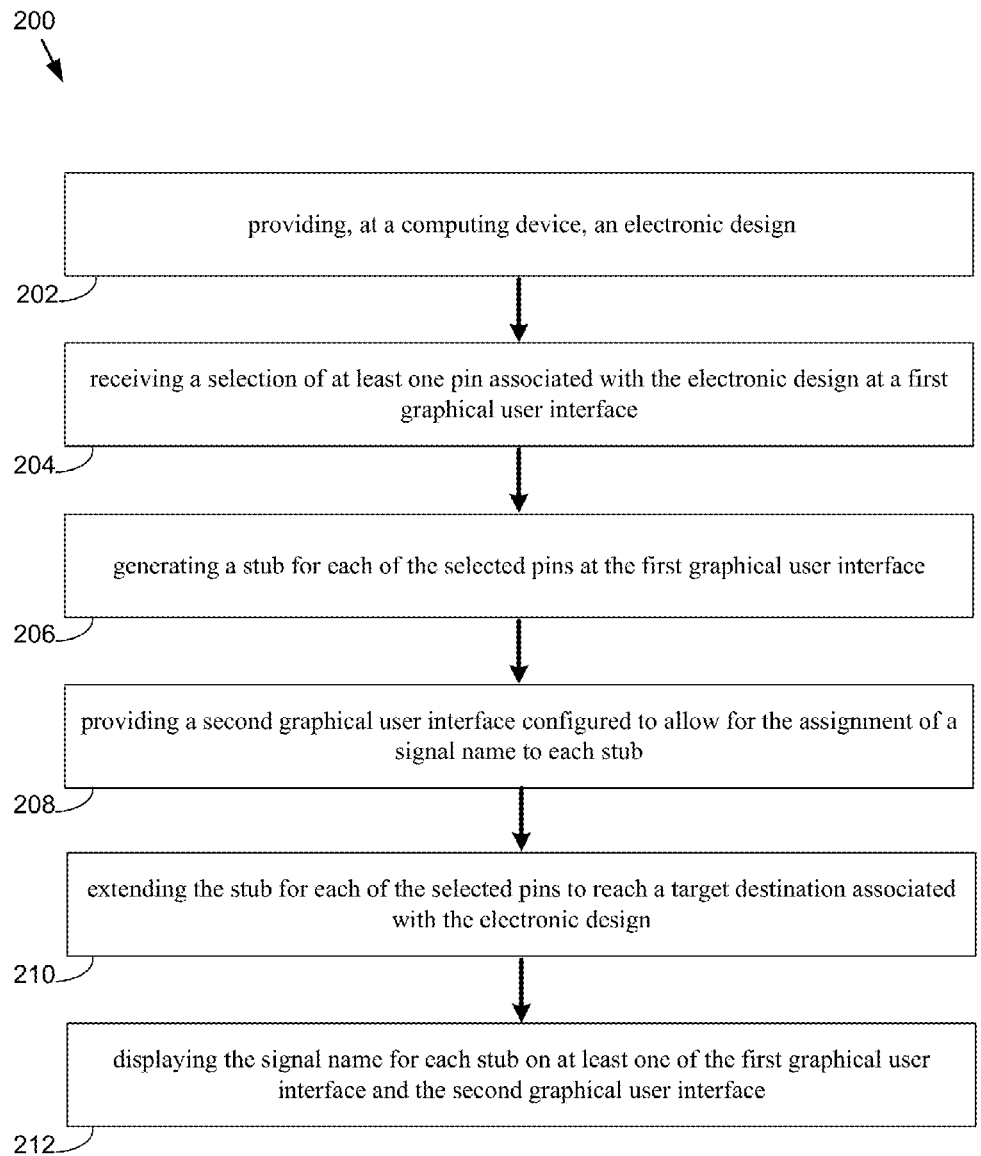
FIG. 2 is a flowchart depicting operations consistent with the connection process of the present disclosure.

Referring now to FIG. 2, an embodiment of connection process 10 is provided. The process may include providing (202) an electronic design and receiving (204) a selection of at least one pin associated with the electronic design at a first graphical user interface. The method may further include generating (206) a stub for each of the selected pins at the first graphical user interface. The method may also include providing (208) a second graphical user interface configured to allow for the assignment of a signal name to each stub. The method may include extending (210) the stub for each of the selected pins to reach a target destination associated with the electronic design. The method may also include displaying (212) the signal name for each stub on at least one of the first graphical user interface and the second graphical user interface.

Referring also to FIG. 3, an embodiment 300 depicting an example of an existing approach to handling wire stubs is provided. As is shown, the current approach to this problem is to manually draw a wire for each connection and then assign a name. The operations to draw stubs may be supported in some tools at a pin level, but net assignment has to be done manually for each connection. Moreover, moving the component does not move the wires along. Instead the open end of the stub is locked. There is no way to tap the stubs from a bus using a drag and drop mechanism for a number of nets. Further, the process of naming a signal takes at least two mouse click per net. Net name generation is not supported in existing schematic tools.

Accordingly, embodiments of connection process 10 described herein may allow for the generation of wire stubs on a selection of pins (e.g., on one or more components). Connection process 10 may also be configured to allow for the assigning of signal names and display them in proper orientation and alignment.

In some embodiments, connection process 10 may assign a signal using a variety of different techniques. Some of these may include, but are not limited to, automatic generation of system defined names, using the signal name same as a pin name, assigning a prefix/suffix to the pin names to generate the name, copying a pasted name from a spreadsheet or any other external tools, assigning a signal using the bits of a bus, automatically connecting to net group members in sequential order, selecting from a list of existing signal names used in design, etc.

Figure 4:
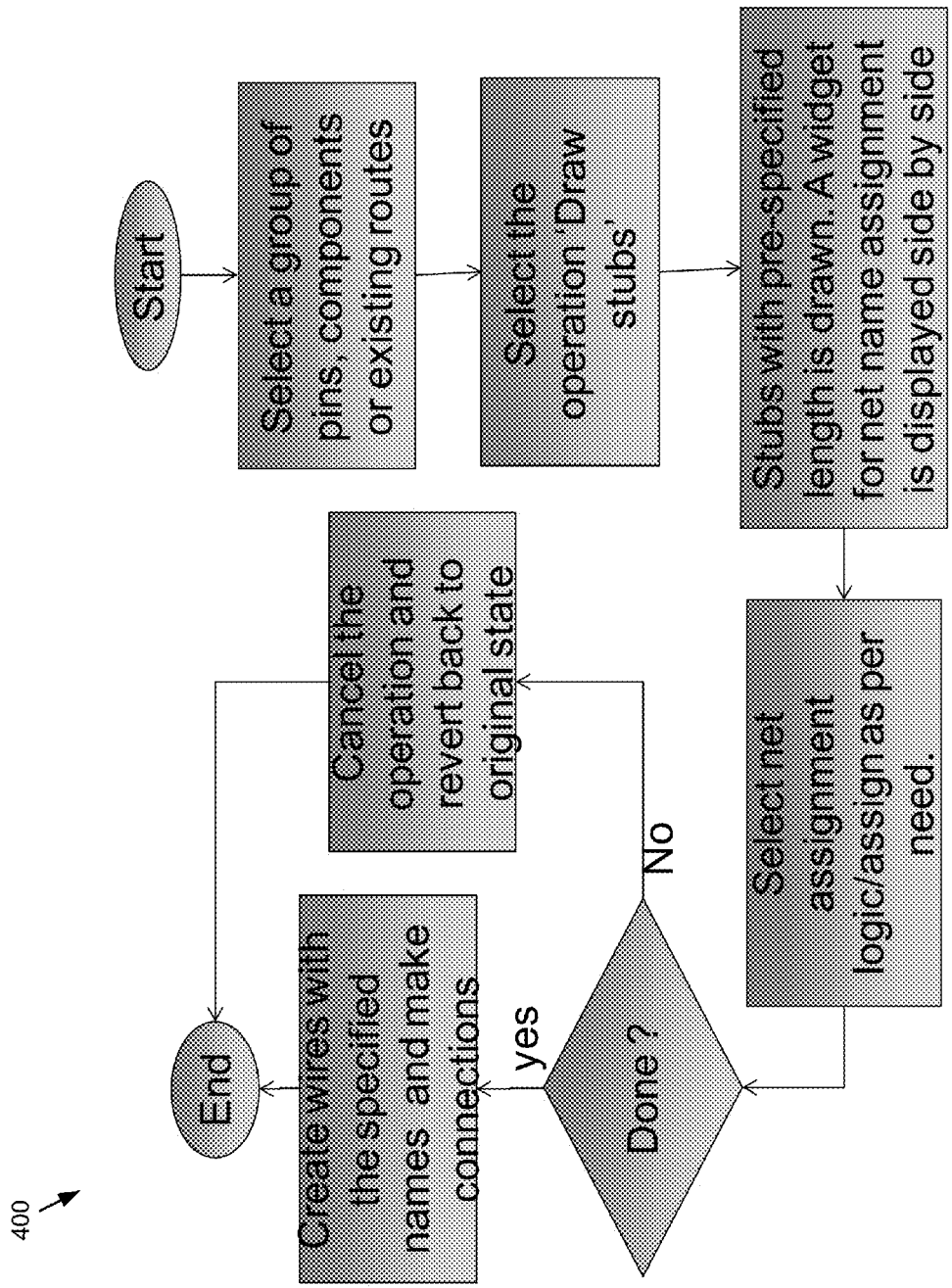
FIG. 4 is a system diagram depicting aspects of the connection process in accordance with an embodiment of the present disclosure.

Referring also to FIG. 4, an embodiment depicting an example 400 consistent with the teachings of the connection process 10 is provided. This particular embodiment is provided merely by way of example and is not intended to limit the teachings of the present disclosure.

In some embodiments, connection process 10 may allow for the selection of a group of pins on same side (e.g., top/ bottom/left/right) and may then generate wires simultaneously from the pins. In some cases, connection process 10 may allow for assigning a signal name in a contextual dialog. Connection process 10 may allow the user to drop the wires on a bus. In some cases, the bus taps may be automatically inserted. Additionally and/or alternatively, connection process 10 may allow a user to select pins of other components to make connections.

In some embodiments, connection process 10 may allow for the selection of already created stubs and may allow the user to drag the end points to a particular component. In some cases, the behavior here may operate similarly to that discussed above.

Figure 5:
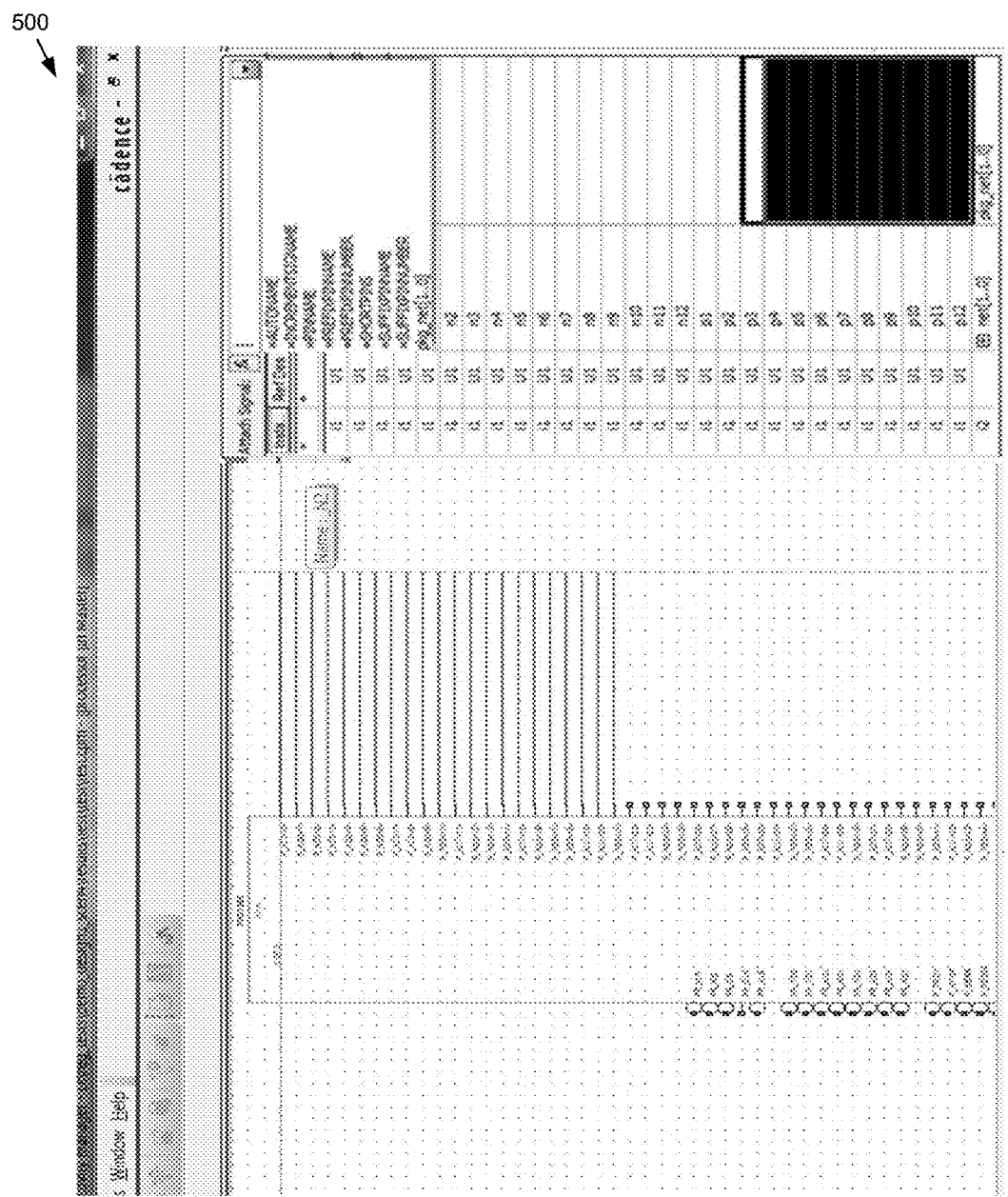
FIG. 5 is a system diagram depicting aspects of the connection process in accordance with an embodiment of the present disclosure.

Referring also to FIG. 5, an embodiment 500 consistent with connection process 10 is provided. In some embodiments, connection process 10 may allow for the generation of multi-wire from pins. Accordingly, the user may assign names in the contextual widget at the right side, while the wire is generated automatically. The names may be annotated automatically as well and in accordance with user settings.

In some embodiments, connection process 10 may enable moving and/or rotating a component. In this way, moving and/or rotating a component with stubs may also move and/or rotate the connected stubs also. In some cases, placing the moved component in a manner so that stub end points connects a bus, would generate a graphical user interface ("GUI") to assign bit range, so that they get connected to signals from the bus with appropriate bit (or bit range in case of vector stubs). In some embodiments, placing the component in a manner that it comes into contact with unconnected component pins would make a connection with that pin if the schematic logic allows that. Otherwise operation will be aborted. Additionally and/or alternatively, placing the component in a manner that it comes into contact with end points of existing stubs may short them if the schematic logic allows that. Otherwise the operation may be aborted.

In some embodiments, connection process 10 may allow a user to opt to convert existing wire connections to stubs with net names annotated to reduce schematic cluttering. For example, this may be particularly useful for a dense schematic diagram.

In some embodiments, connection process 10 may allow a user to assign a signal name to stubs by selecting one or more stubs and opting the assign signal name operations. For example, a signal name assignment widget may be shown with all the options described herein. The existing name may be displayed as visual cues in each of the stubs so that user can identify them. On finishing the operations, the name may be displayed in the stubs. Connection process 10 may include one or more settings to automatically adjust the stub length in case the name exceeds the stub length. The stub length may be sufficient enough to accommodate the longest name among the selected stubs.

Figure 6:
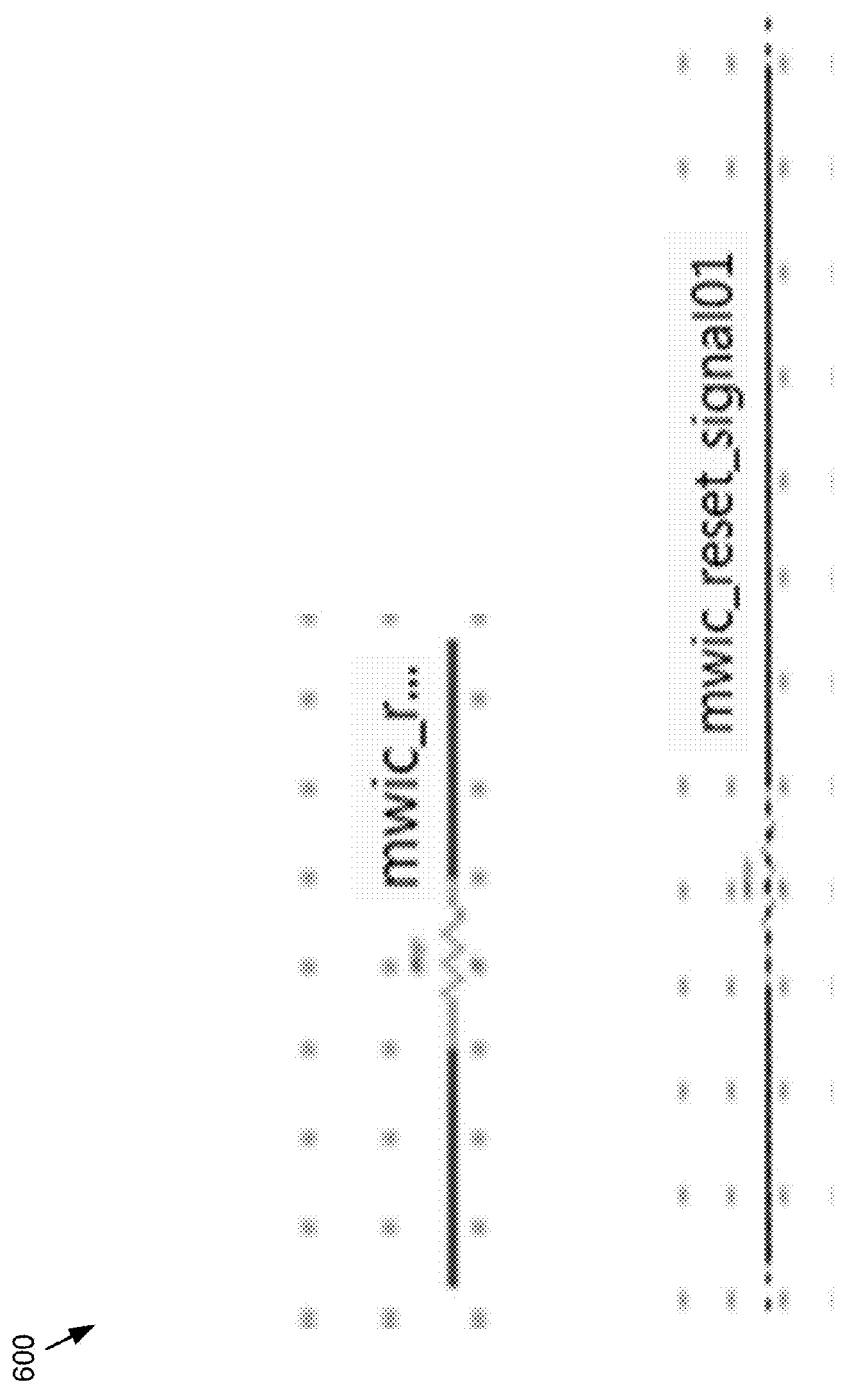
FIG. 6 is a system diagram depicting aspects of the connection process and signal naming in accordance with an embodiment of the present disclosure.

Referring also to FIG. 6, an embodiment 600 depicting a stub name length adjustment example is provided. For example, if the option to elongate stubs is not selected, and the name is longer than the stub length, ellipses may be displayed at the end where the name length exceeds the stub length as shown in FIG. 6. Dragging the end point of the stubs may make the name visible.

Figure 7:
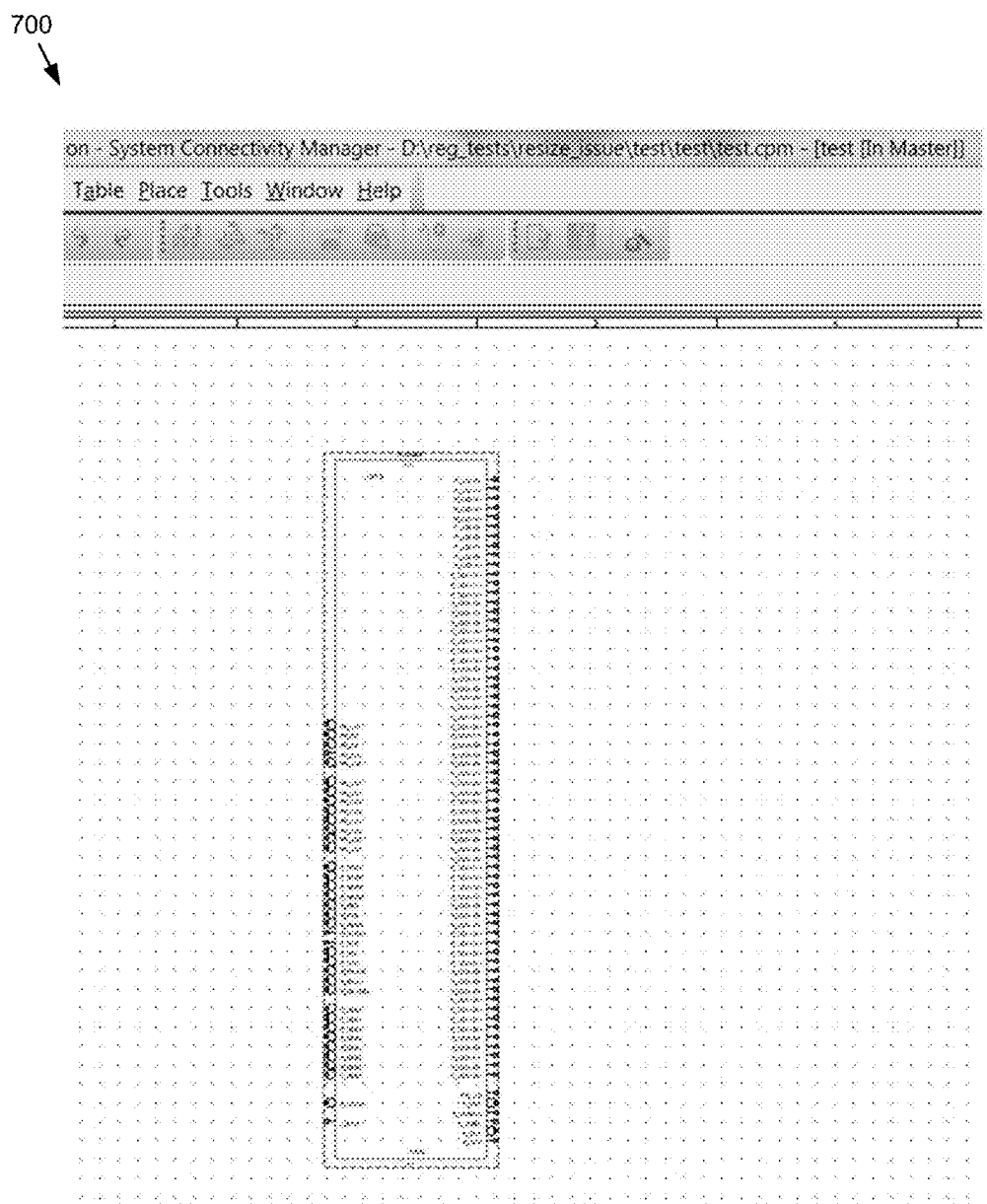
FIG. 7 is a system diagram depicting aspects of the connection process in accordance with an embodiment of the present disclosure.

Referring also to FIG. 7, an embodiment 700 depicting a graphical user interface that may be used in accordance with connection process 10 is provided. Connection process 10 may allow for the generation of wires for a group of pins and for the assignment of names based on some criteria. Some of these may include, but are not limited to, prefix/suffix names, copy paste from spreadsheet, assign pin name as net name, automatically assign names (e.g., internal).

Figure 8:
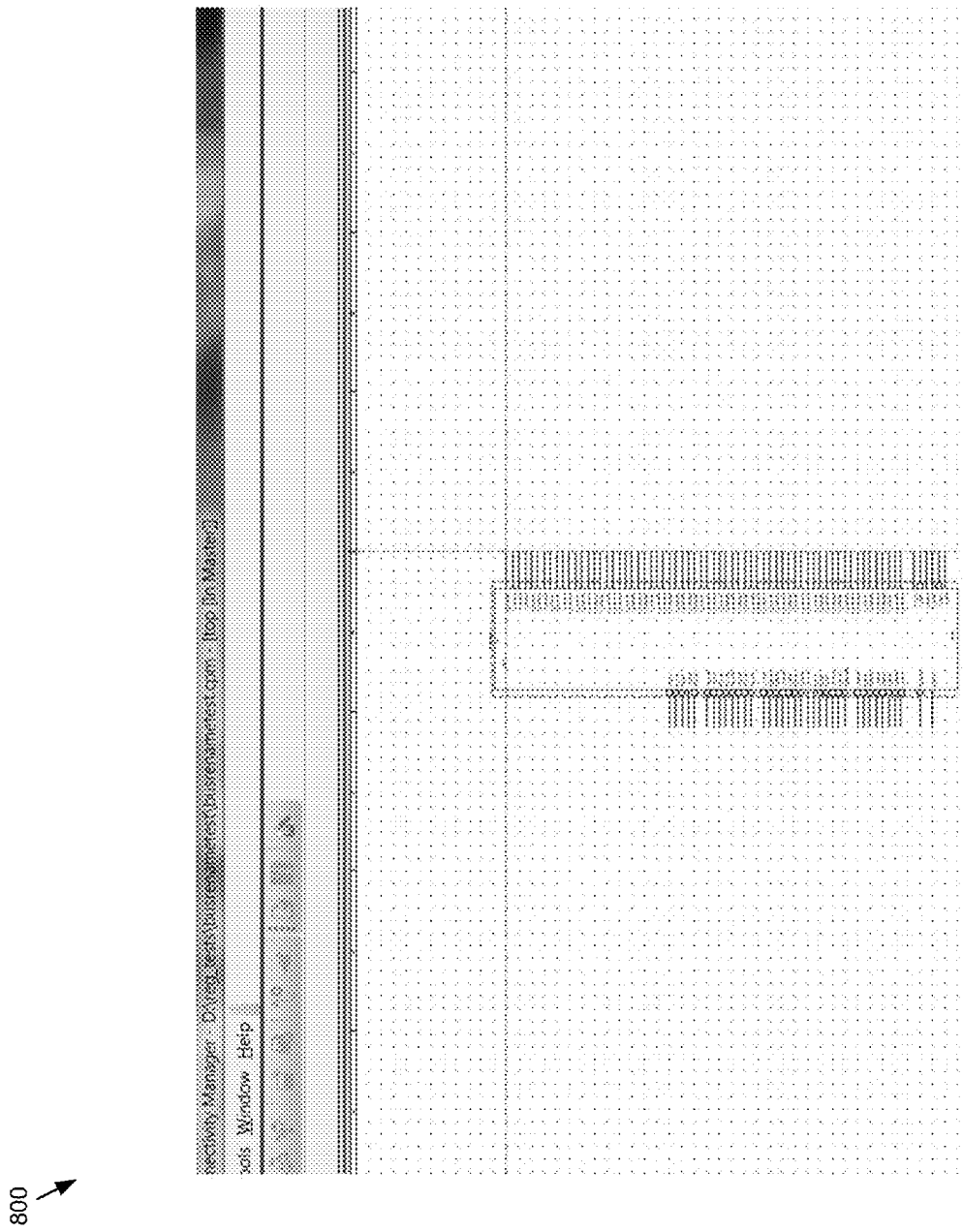
FIG. 8 is a system diagram depicting aspects of the connection process in accordance with an embodiment of the present disclosure.

Referring also to FIG. 8, an embodiment 800 depicting a graphical user interface that may be used in accordance with connection process 10 is provided. Connection process 10 may allow for a user to select a group of pins and select a "draw wire" option. Accordingly, wires may be drawn up to the cursor, which may also get extended on mouse move. This may allow for the creation of named wires for groups of pins quickly and efficiently (e.g. using one mouse click, etc.).

Figure 9:
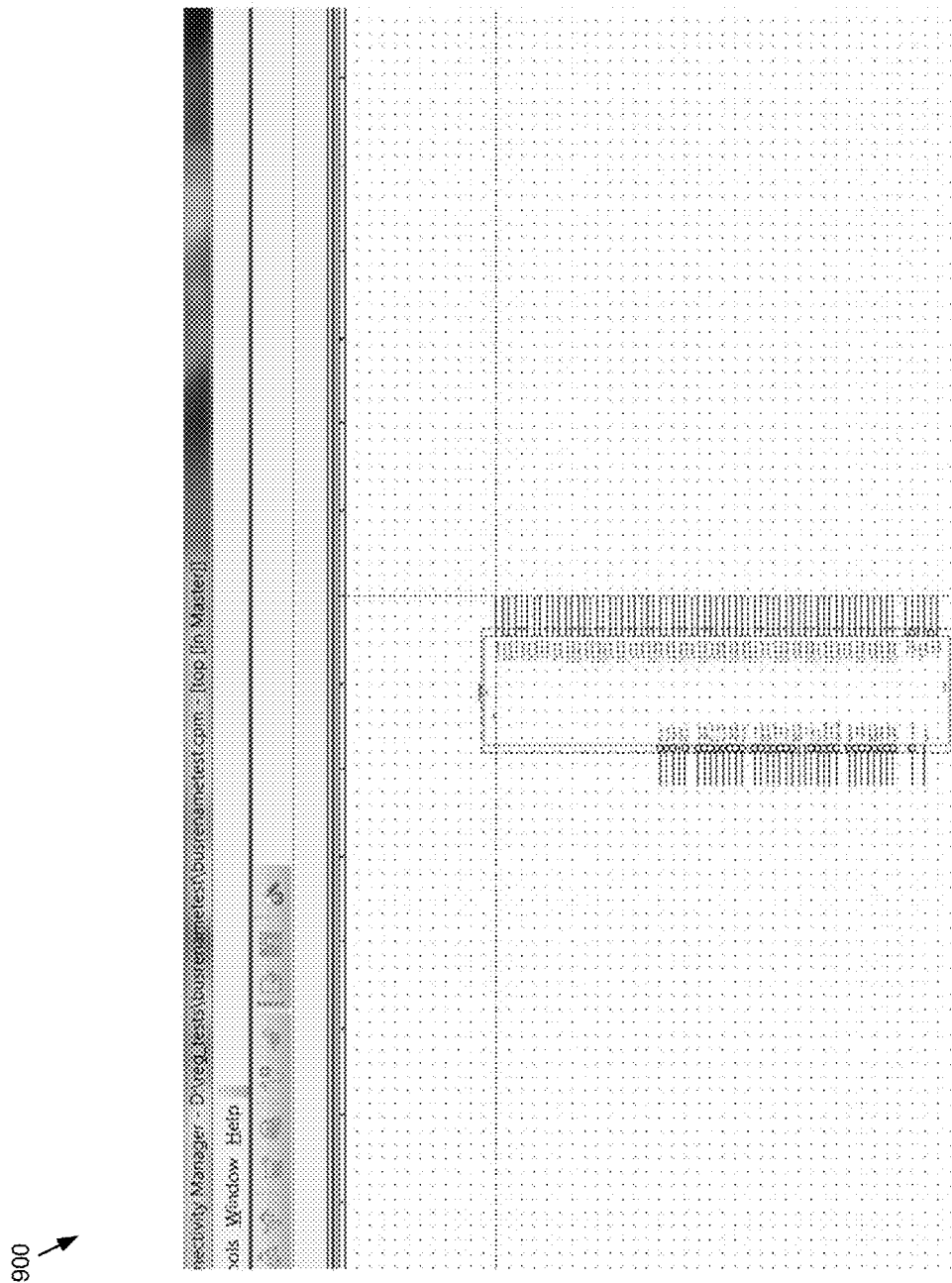
FIG. 9 is a system diagram depicting aspects of the connection process in accordance with an embodiment of the present disclosure.

Referring also to FIG. 9, an embodiment 900 depicting a graphical user interface that may be used in accordance with connection process 10 is provided. Connection process 10 may generate a graphical user interface (e.g., widget in the right hand side of FIG. 9), which may provide an option for signal naming. Various options may be provided for assigning names. User may enter name for some of all of the nets. If no name is assigned internal name will be generated. This may allow the user to name a group of wires quickly and efficiently (e.g. using one mouse click, etc.).

Figure 10:
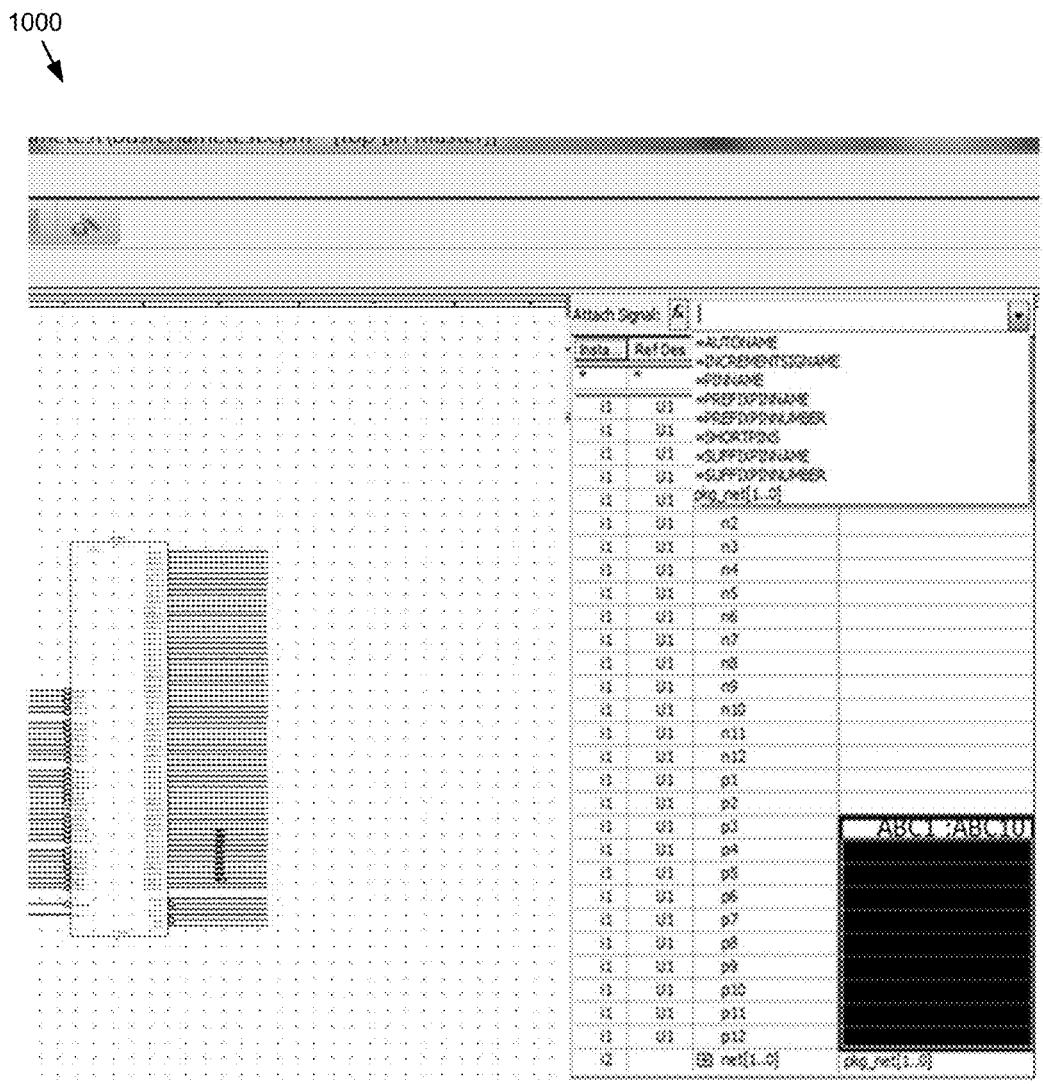
FIG. 10 is a system diagram depicting aspects of the connection process in accordance with an embodiment of the present disclosure.

Referring also to FIG. 10, an embodiment 1000 depicting a graphical user interface that may be used in accordance with connection process 10 is provided. Connection process 10 may allow for a net name annotation for the wires against which names are assigned.

Figure 11:
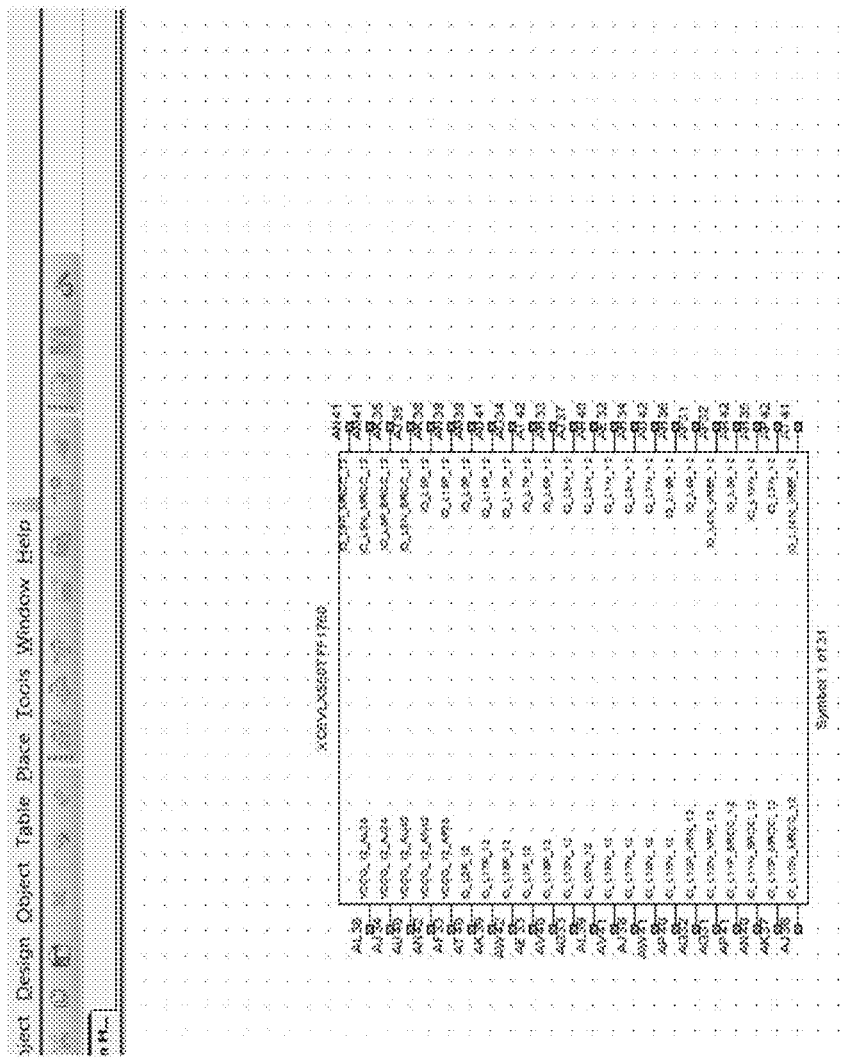
FIG. 11 is a system diagram depicting aspects of the connection process in accordance with an embodiment of the present disclosure.

Referring also to FIG. 11, an embodiment 1100 depicting a graphical user interface that may be used in accordance with connection process 10 is provided. Connection process 10 may draw and/or generate wire stubs for a large pin count part and assign names with some naming criteria such as those described herein.

Figure 12:
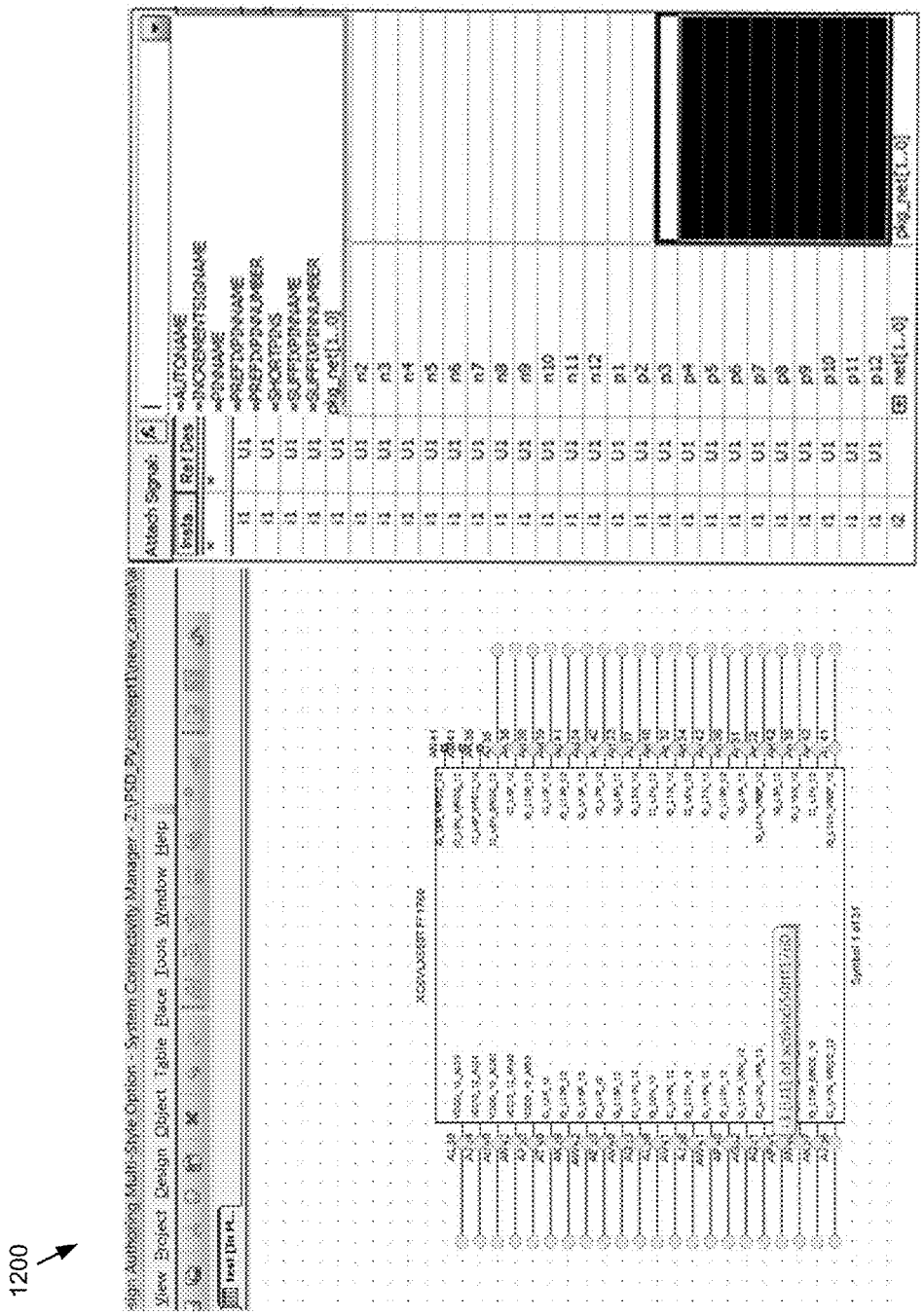
FIG. 12 is a system diagram depicting aspects of the connection process in accordance with an embodiment of the present disclosure.

Referring also to FIG. 12, an embodiment 1200 depicting a graphical user interface that may be used in accordance with connection process 10 is provided. Connection process 10 may allow a user to select the part and opt to draw or generate stubs automatically. Accordingly, wires drawn as stubs with the newly created stubs selected. As before, the widget on the right hand side shows an option for naming the stubs.

Figure 13:
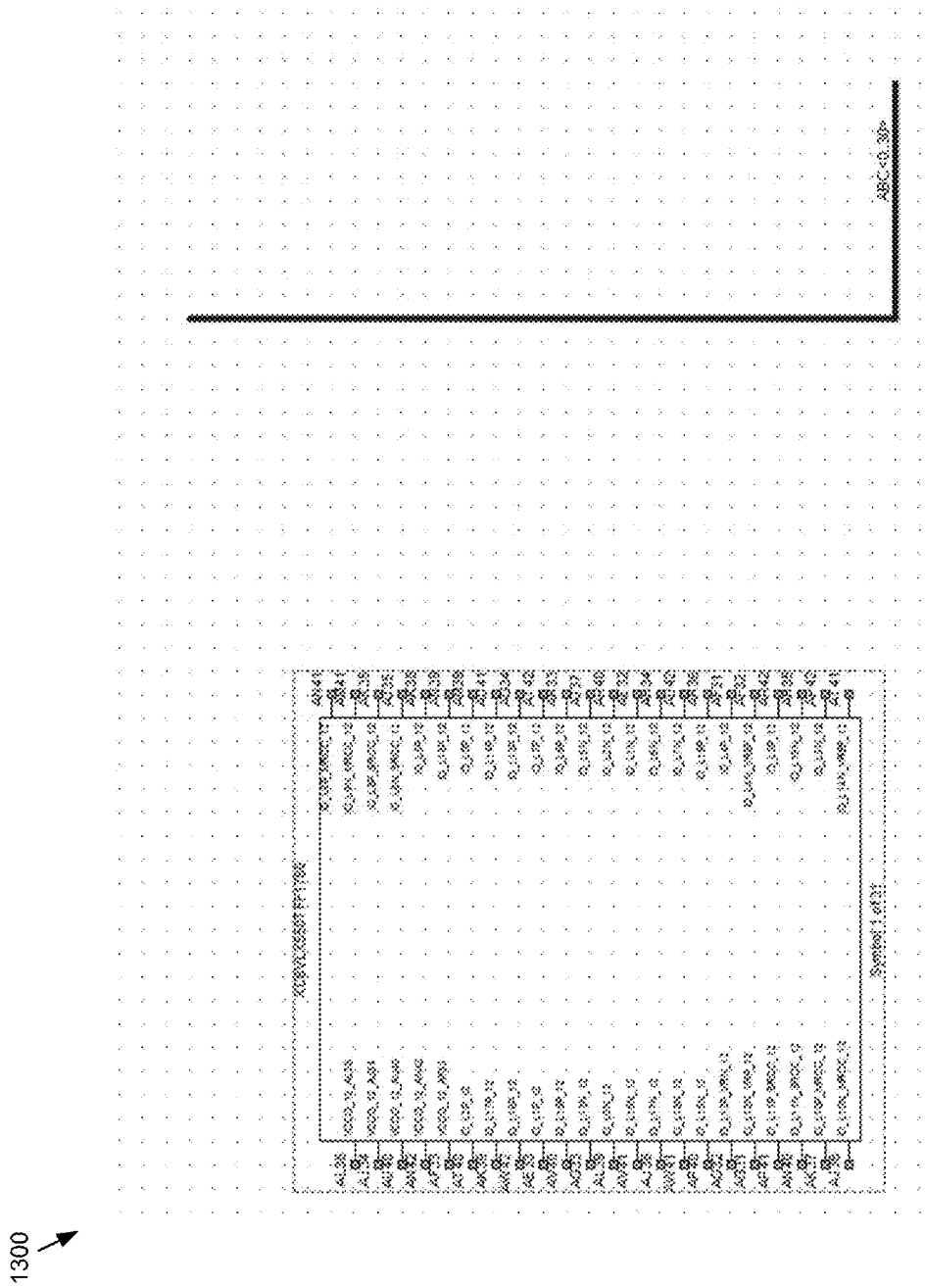
FIG. 13 is a system diagram depicting aspects of the connection process in accordance with an embodiment of the present disclosure.

Referring also to FIG. 13, an embodiment 1300 depicting a graphical user interface that may be used in accordance with connection process 10 is provided. Connection process 10 may allow for tapping out signals from a bus for a group of pins quickly and efficiently.

Figure 14:
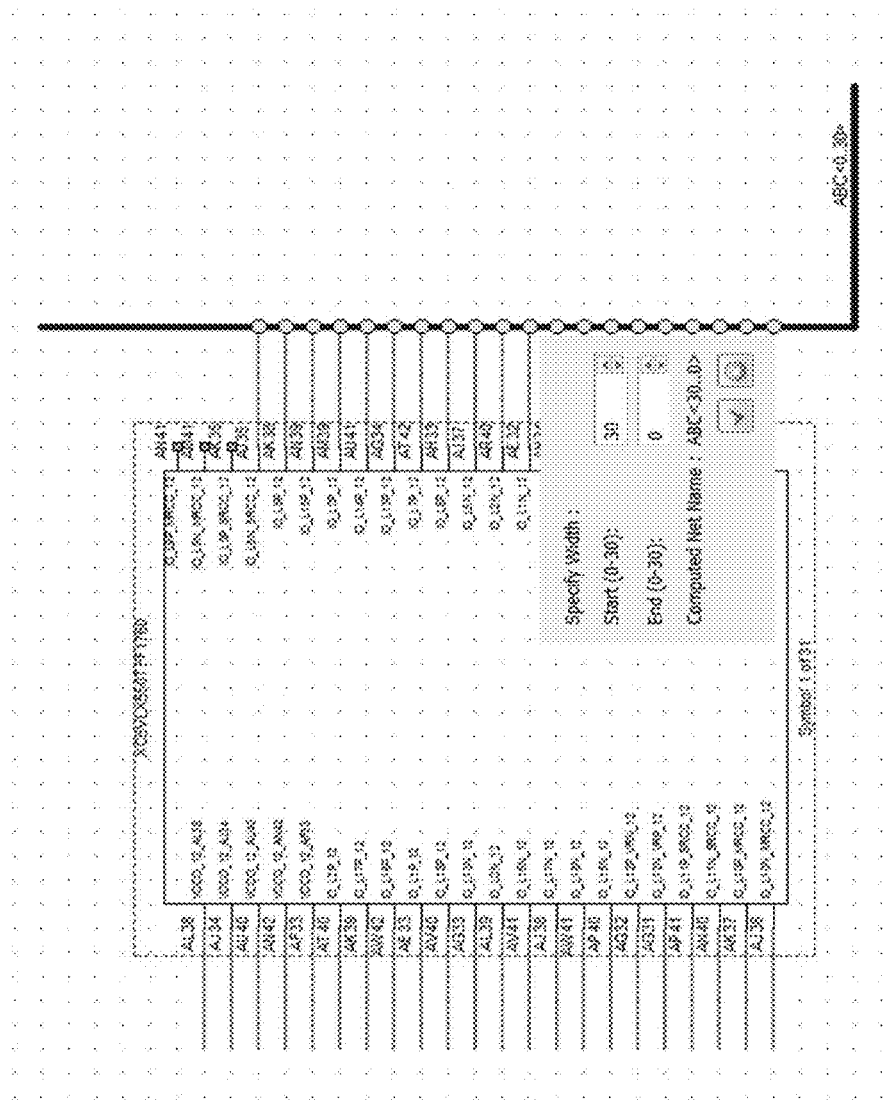
FIG. 14 is a system diagram depicting aspects of the connection process in accordance with an embodiment of the present disclosure.

Referring also to FIG. 14, an embodiment 1400 depicting a graphical user interface that may be used in accordance with connection process 10 is provided. In one particular example, connection process may allow for the drawing of stubs, the moving of the stubbed part, and subsequent dropping on the bus. In some embodiments, bus taps may be placed and connected to the wire stubs and names assigned based on a specified range. The user may then move the part to the position he/she wanted with connections retained.

Figure 15:
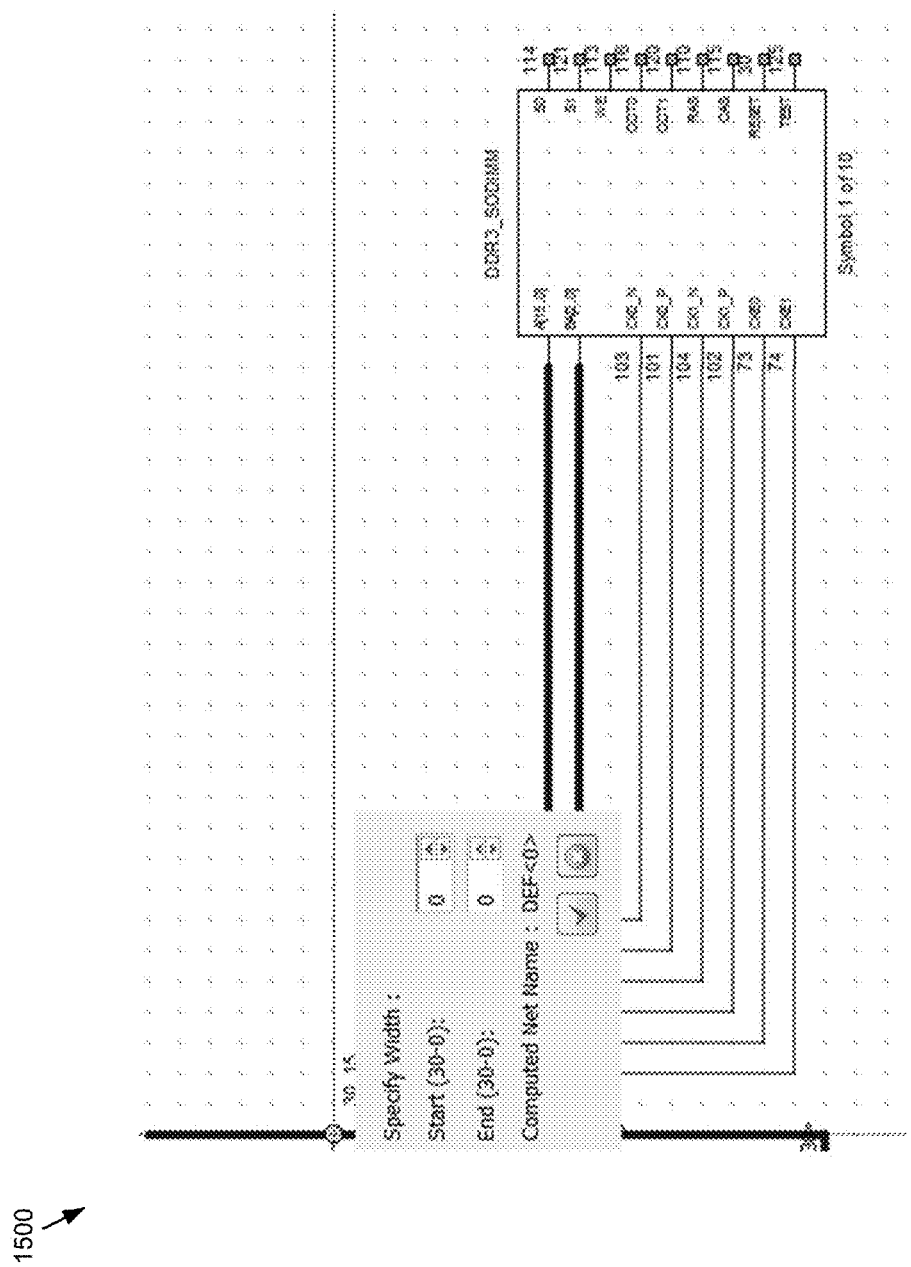
FIG. 15 is a system diagram depicting aspects of the connection process in accordance with an embodiment of the present disclosure.

Referring also to FIG. 15, an embodiment 1500 depicting a graphical user interface that may be used in accordance with connection process 10 is provided. In some embodiments, connection process 10 may allow for selection of pins and may begin drawing the wire automatically. The user may move the mouse and drop on the bus. As is shown in FIG. 15, an option may be provided for selecting the range. Bus taps may be placed and connected to the wire stubs. The user may then move the part to the position he/she wanted with connections retained.

Figure 16:
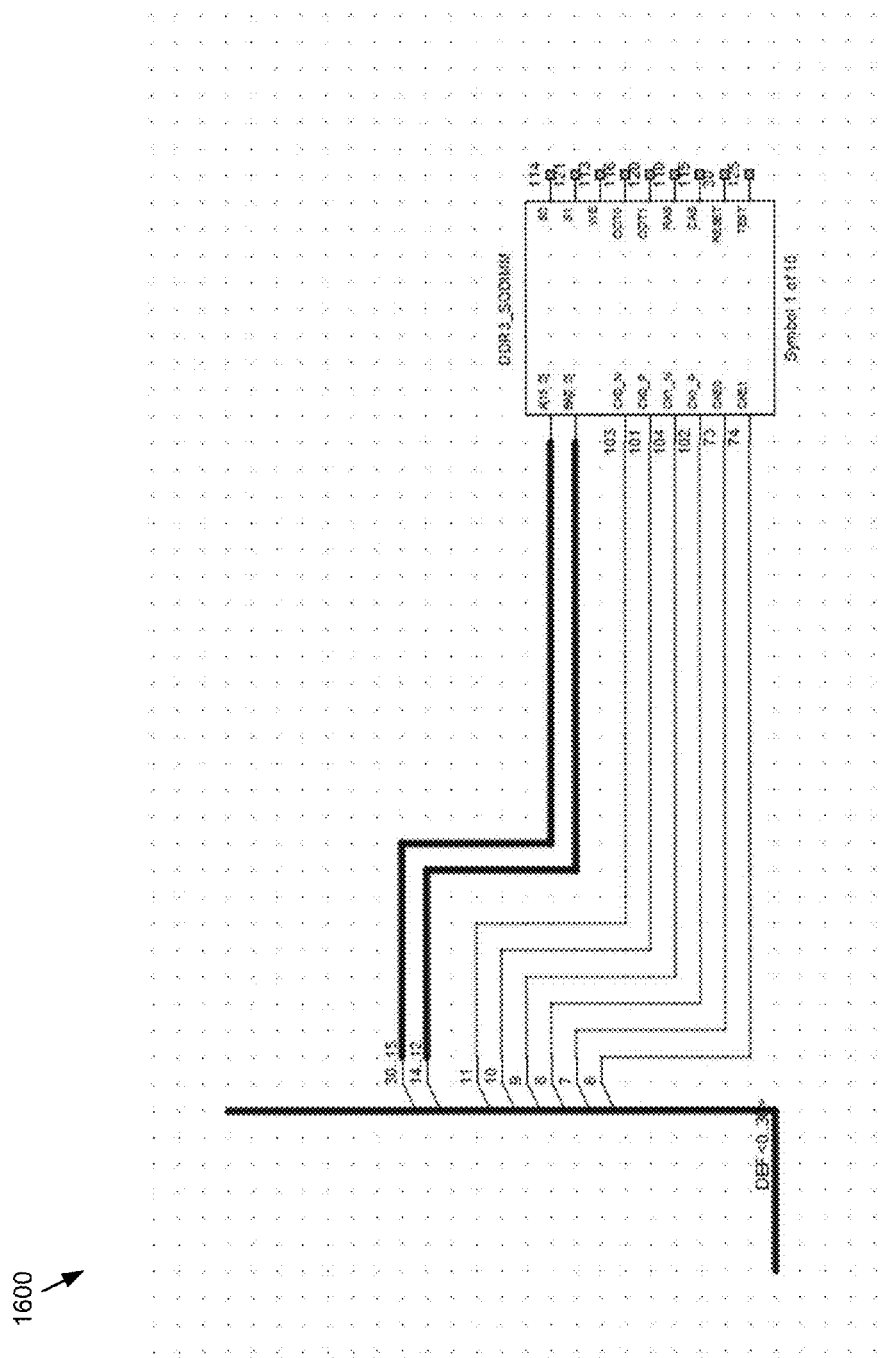
FIG. 16 is a system diagram depicting aspects of the connection process in accordance with an embodiment of the present disclosure.

Referring also to FIG. 16, an embodiment 1600 depicting a graphical user interface that may be used in accordance with connection process 10 is provided. In some embodiments, connection process 10 may generate an output such as that shown in FIG. 16. Accordingly, connection process 10 allows for the generation and tapping out of signals in as few as two clicks for n pins as is shown in FIG. 16.

Figure 17:
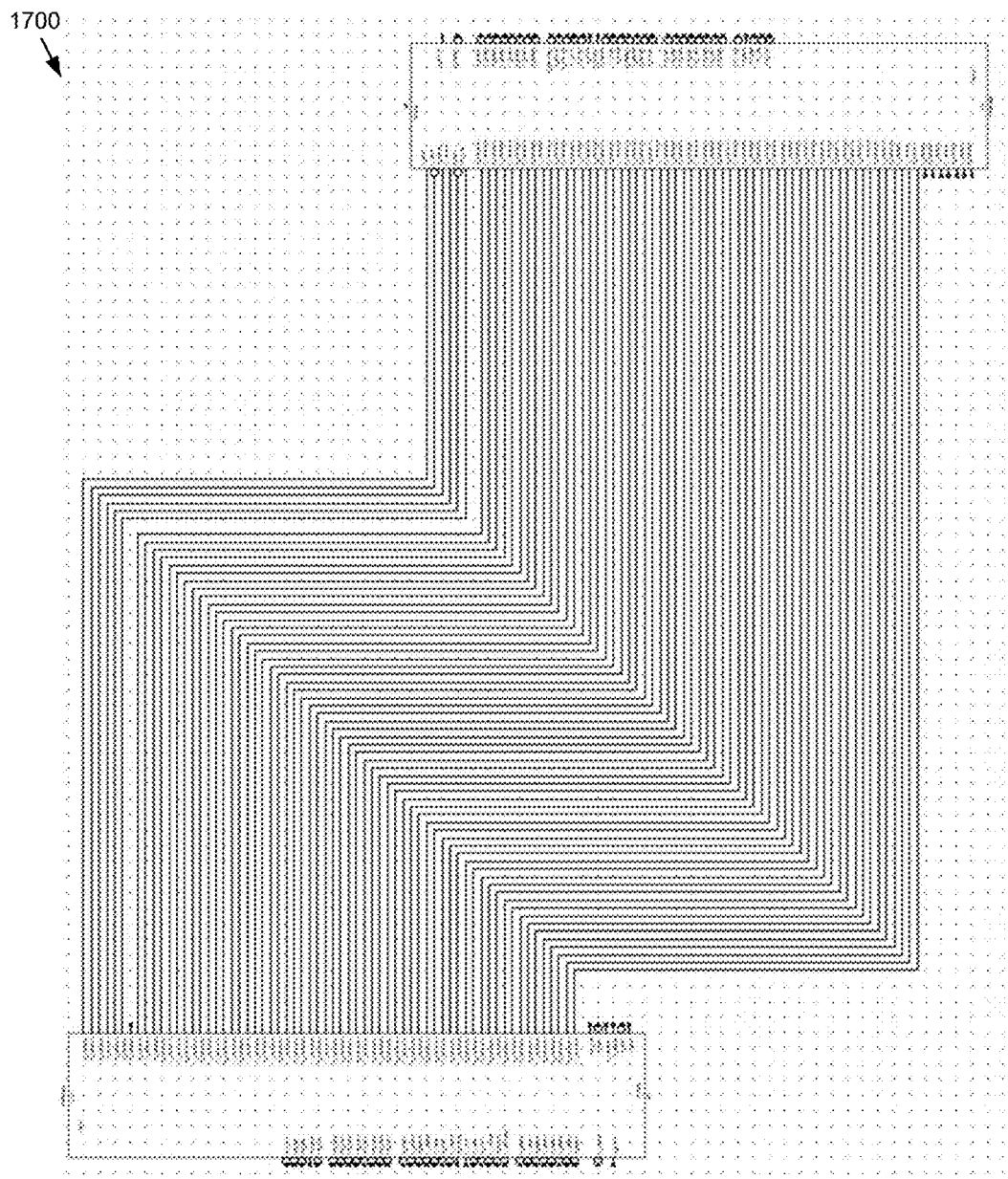
FIG. 17 is a system diagram depicting aspects of the connection process in accordance with an embodiment of the present disclosure.

Referring also to FIG. 17, an embodiment 1700 depicting a graphical user interface that may be used in accordance with connection process 10 is provided. In some embodiments, connection process 10 may allow for the selection of a group of connected wires and conversion to stubs.

Figure 18:
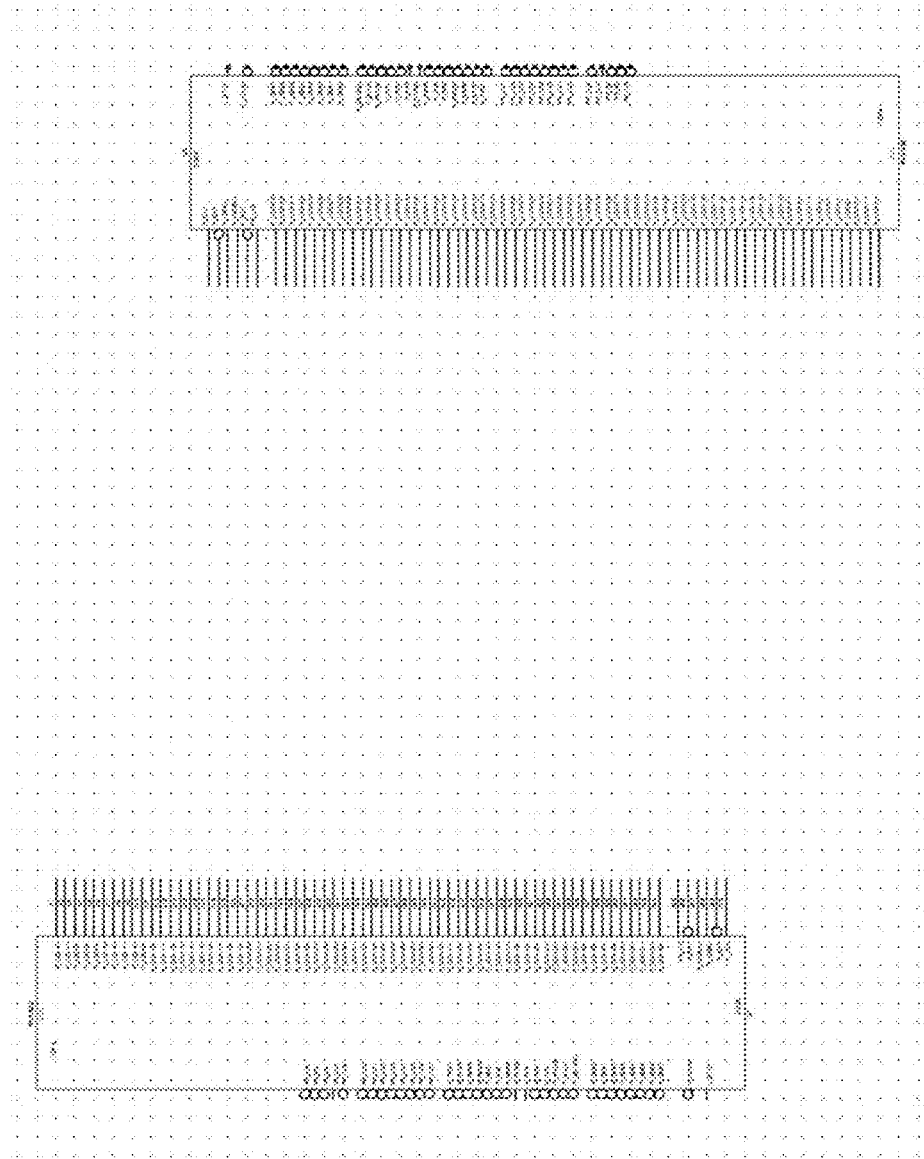
FIG. 18 is a system diagram depicting aspects of the connection process in accordance with an embodiment of the present disclosure.

Referring also to FIG. 18, an embodiment 1800 depicting a graphical user interface that may be used in accordance with connection process 10 is provided. In some embodiments, connection process 10 may allow for the selection of a group of connected wires and for the automatic generation of stubs as discussed herein. Accordingly, wires may be replaced by stubs with net names annotated on them, which is helpful in decongesting a dense schematic.

In some embodiments, EDA application 20 and/or connection process 10 may support a variety of languages and/or standards. EDA application 20 may support one or more software extensions, which may provide a high-throughput channel between the testbench and the device under test (DUT), and enable automated metric driven verification of embedded software exactly as if it were another part of the DUT.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for visualization in an electronic design comprising:
   providing, at a computing device, an electronic design;
   receiving, via the computing device, a selection of at least one pin associated with the electronic design at a first graphical user interface;
   generating, via the computing device, a stub for each of the selected pins at the first graphical user interface;
   providing a second graphical user interface configured to allow for the assignment of a signal name to each stub;
   extending the stub for each of the selected pins to reach a target destination associated with the electronic design; and
   displaying the signal name for each stub on at least one of the first graphical user interface and the second graphical user interface.

2. The computer-implemented method of claim 1, further comprising:
   inserting one or more bus taps at the first graphical user interface.

3. The computer-implemented method of claim 1, wherein extending occurs in response to user selection of at least one of the stub and a target pin associated with the target destination.

4. The computer-implemented method of claim 1, wherein at least one stub is associated with a component.

5. The computer-implemented method of claim 4, further comprising:
   rotating the component within the first graphical user interface, wherein rotating the component includes rotating the at least one stub.

6. The computer-implemented method of claim 1, further comprising:
   converting one or more existing wire connections of the electronic design to a stub.

7. The computer-implemented method of claim 1, further comprising:
   adjusting a stub length of the stub based upon, at least in part, a length of the signal name.

8. A non-transitory computer-readable storage medium having stored thereon instructions that when executed by a machine result in the following operations:
   providing, at a computing device, an electronic design;
   receiving a selection of at least one pin associated with the electronic design at a first graphical user interface;
   generating a stub for each of the selected pins at the first graphical user interface;
   providing a second graphical user interface configured to allow for the assignment of a signal name to each stub;
   extending the stub for each of the selected pins to reach a target destination associated with the electronic design; and
   displaying the signal name for each stub on at least one of the first graphical user interface and the second graphical user interface.

9. The computer-readable storage medium of claim 8, further comprising:
   inserting one or more bus taps at the first graphical user interface.

10. The computer-readable storage medium of claim 8, wherein extending occurs in response to user selection of at least one of the stub and a target pin associated with the target destination.

11. The computer-readable storage medium of claim 8, wherein at least one stub is associated with a component.

12. The computer-readable storage medium of claim 11, further comprising:
   rotating the component within the first graphical user interface, wherein rotating the component includes rotating the at least one stub.

13. The computer-readable storage medium of claim 8, further comprising:
   converting one or more existing wire connections of the electronic design to a stub.

14. The computer-readable storage medium of claim 8, further comprising:
   adjusting a stub length of the stub based upon, at least in part, a length of the signal name.

15. A system for visualization in an electronic design comprising:
   one or more processors configured to receive an electronic design, the one or more processors further configured to receive a selection of at least one pin associated with the electronic design at a first graphical user interface, the one or more processors further configured to generate a stub for each of the selected pins at the first graphical user interface, the one or more processors further configured to provide a second graphical user interface configured to allow for the assignment of a signal name to each stub, the one or more processors further configured to extend the stub for each of the selected pins to reach a target destination associated with the electronic design, the one or more processors further configured to display the signal name for each stub on at least one of the first graphical user interface and the second graphical user interface.

16. The system of claim 15, further comprising:
inserting one or more bus taps at the first graphical user interface.

17. The system of claim 15, wherein extending occurs in response to user selection of at least one of the stub and a target pin associated with the target destination.

18. The system of claim 15, wherein at least one stub is associated with a component.

19. The system of claim 18, further comprising:
rotating the component within the first graphical user interface, wherein rotating the component includes rotating the at least one stub.

20. The system of claim 15, further comprising:
converting one or more existing wire connections of the electronic design to a stub.

\* \* \* \* \*